(12) United States Patent
Schulze et al.

(10) Patent No.: US 9,472,395 B2
(45) Date of Patent: Oct. 18, 2016

(54) SEMICONDUCTOR ARRANGEMENT INCLUDING BURIED ANODIC OXIDE AND MANUFACTURING METHOD

(71) Applicant: Infineon Technologies AG, Neubiberg (DE)

(72) Inventors: Hans-Joachim Schulze, Taufkirchen (DE); Ingo Muri, Villach (AT); Iris Moder, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/594,838

(22) Filed: Jan. 12, 2015

(65) Prior Publication Data

US 2016/0203977 A1  Jul. 14, 2016

(51) Int. Cl.
   *H01L 21/02*  (2006.01)
   *H01L 21/74*  (2006.01)
   *H01L 21/225* (2006.01)

(52) U.S. Cl.
   CPC ..... *H01L 21/02258* (2013.01); *H01L 21/2252* (2013.01); *H01L 21/74* (2013.01)

(58) Field of Classification Search
   CPC .............. H01L 21/02258; H01L 21/2252; H01L 21/74
   See application file for complete search history.

(56) References Cited

U.S. PATENT DOCUMENTS 6,352,893 B1 * 3/2002 Michaelis .............. C25D 11/32
                                                257/E21.288

FOREIGN PATENT DOCUMENTS

DE        19904865 A1    5/2000

OTHER PUBLICATIONS

Khlebnikov, et al., "Rapid Anodic Oxidation of 6H-SiC", Materials Science Forum vols. 264-268 (1998), pp. 873-876.
Muri, , "Untersuchung elektrochemischer Prozesse für Anwendungen in der Mikro- und Optoelektronik", Abstract from Muri's Dissertation for the Vienna University of Technology, 3-5.
Udrea, et al., "Ultra-fast LIGBTs and superjunction devices in membrane technology", Proceedings of the 17th International Symposium on Power Semiconductor Devices & IC's May 23-26, 2005, pp. 1-3 & 162.
Zhang, , "Electrochemistry of Silicon and its Oxide", 2001 ed., Oct. 15, 2001, pp. 91-130.

* cited by examiner

*Primary Examiner* — Roy Potter
*Assistant Examiner* — Paul Patton
(74) *Attorney, Agent, or Firm* — Murphy, Bilak & Homiller, PLLC (57) ABSTRACT

In accordance with a method of manufacturing a semiconductor arrangement, a first trench is formed into a semiconductor body from a first side. An anodic oxide structure is formed at a bottom side of the first trench by immersing the semiconductor body in an electrolyte and applying an anodizing voltage between the semiconductor body and an electrode in contact with the electrolyte.

22 Claims, 8 Drawing Sheets

SEMICONDUCTOR ARRANGEMENT INCLUDING BURIED ANODIC OXIDE AND MANUFACTURING METHOD

BACKGROUND

Semiconductor technologies including buried insulators are the basis of many semiconductor applications. By way of example, Silicon on insulator (SOI) technology is based on a layered silicon-insulator-silicon substrate in place of conventional silicon substrates to reduce parasitic device capacitance and substrate current injection, for example. Some methods of manufacturing of SOI substrates, for example Separation by Implanted Oxygen (SIMOX) or Smart-Cut processes require ion implantation processes and/or wafer bonding, thereby increasing process complexity and process costs.

An improved method of manufacturing a semiconductor arrangement including a buried oxide would be desirable.

SUMMARY

An embodiment of a method of manufacturing a semiconductor arrangement comprises forming a first trench into a semiconductor body from a first side. The method further comprises forming an anodic oxide structure at a bottom side of the first trench by immersing the semiconductor body in an electrolyte and applying an anodizing voltage between the semiconductor body and an electrode in contact with the electrolyte.

An embodiment of a semiconductor arrangement comprises a semiconductor body. The semiconductor arrangement further comprises an anodic oxide structure buried in the semiconductor body. The buried anodic oxide structure includes at least two buried anodic oxide parts merged together, each of the at least two buried anodic oxide parts having a convex surface portion.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "semiconductor arrangement", "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside surface while the first surface is considered to be formed by the upper, front or main surface of the semiconductor substrate. The terms "above" and "below" as used in this specification therefore describe a relative location of a structural feature to another In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped.

The semiconductor device may have terminal contacts such as contact pads (or electrodes) which allow electrical contact to be made with the integrated circuits or secrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), PVD (physical vapor deposition), evaporation, hybrid physical-chemical vapor deposition (HPCVD), etc.

The applied conductive layer may comprise, inter alia, one or more of a layer of metal such as Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into individual chips. Any technique for dicing may be applied, e.g., blade dicing (sawing), laser dicing, etching, etc. In particular, stealth dicing, which is a specific technique using laser dicing may be applied. Stealth dicing allows suppressing cutting waste and is therefore a suitable process for cutting work pieces that are vulnerable to contamination. Further, it is a dry process that does not require cleaning, and is therefore also suitable for processing sensitive structures such as, e.g., MEMS, that are vulnerable to load. Further benefits which may be achieved by the stealth dicing technology are high-speed dicing, superior breakage strength, small kerf and low running costs.

In stealth dicing technology, a laser beam of a wavelength capable of transmitting through the semiconductor wafer is focused onto a point inside the semiconductor wafer. Due to a non-linear absorption effect, only localized points inside the semiconductor wafer may be selectively laser-machined, whereby damaging of the front and back surface of the semiconductor wafer may be avoided. The semiconductor wafer can be diced by moving the relative positions of the laser beam and the semiconductor wafer in order to scan the semiconductor wafer according to the desired dicing pattern.

The semiconductor body, for example a semiconductor wafer may be diced by applying the semiconductor wafer on a tape, in particular a dicing tape, apply the dicing pattern, in particular a rectangular pattern, to the semiconductor wafer, e.g., according to one or more of the above mentioned techniques, and pull the tape, e.g., along four orthogonal directions in the plane of the tape. By pulling the tape, the semiconductor wafer gets divided into a plurality of semiconductor dies (chips).

Figure 1A:
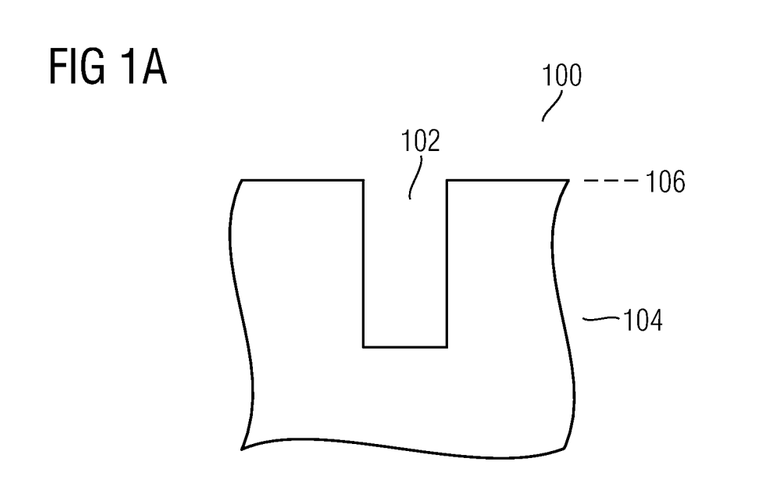
FIGS. 1A to 1B are schematic cross-sectional views of a semiconductor body for illustrating an embodiment of a method of manufacturing a semiconductor arrangement.
Figure 1B:
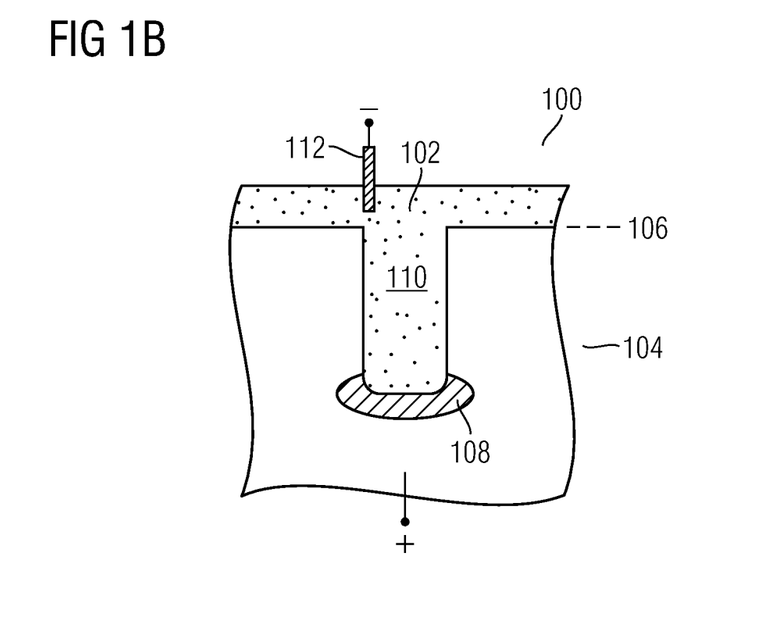

An embodiment of a method of manufacturing a semiconductor arrangement 100 is illustrated in the schematic cross-sectional views of FIGS. 1A and 1B.

a. The schematic cross-sectional view of FIG. 1A illustrates the process of forming a first trench 102 into a semiconductor body 104 from a first side 106.

The schematic cross-sectional view of FIG. 1B illustrates the process of forming an anodic oxide structure 108 at a bottom side of the first trench 102 by immersing the semiconductor body 104 in an electrolyte 110 and applying an anodizing voltage between the semiconductor body 104 and an electrode 112 in contact with the electrolyte 110.

The first trench 102 may be formed by a masked etch process, for example by dry etching such as plasma etching. A mask may be formed by lithography as a hard mask or resist mask, for example. According to other embodiments, the first trench 102 may also be formed by a masked wet etch process.

As the electrolyte 110, any suitable electrolyte may be chosen that is capable of forming an anodic oxide layer on the semiconductor body 104 by an anodic oxidation process. When forming the anodic oxide structure 108 by oxidizing silicon or silicon carbide, nitric acid ($HNO_3$) may be chosen as the electrolyte 110, for example. Further examples include aqueous solutions and organic solvents, for example $NH_4OH$, $H_3PO_4$, DI water, KOH, TMAH, $H_2SO_4$, $K_2SO_4$, HCl, KNO₃, CH₃OH. The anodic oxidation process may be carried out by alternating-current (AC) anodic oxidation and/or direct current (DC) anodic oxidation, for example.

The semiconductor body 104, for example a semiconductor wafer, may be immersed into an electrolyte bath, and, depending upon the type of electrolyte and a desired thickness of the anodic oxide structure 108, a voltage in the range of several to several hundred Volts may be applied between the semiconductor body 104 and the electrode 112 for a time sufficient to achieve a desired growth thickness of the anodic oxide structure 108. Prior to immersing the semiconductor body 104 into the electrolyte 110, one or more cleaning processes may be carried out, for example an etch process in diluted hydrofluoric acid (HF).

Figure 2:
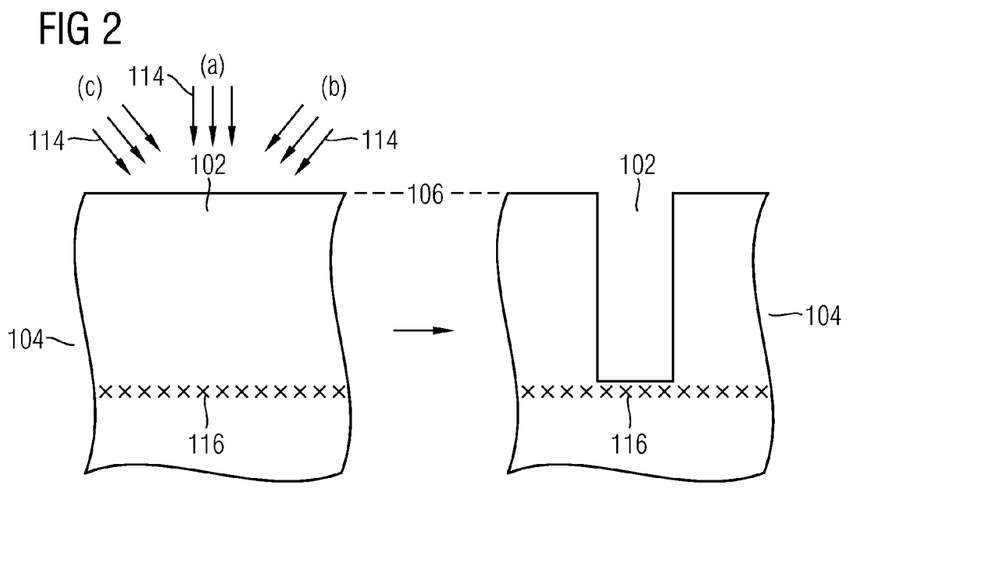
FIG. 2 is schematic cross-sectional view of a semiconductor body for illustrating an embodiment of irradiating the semiconductor body with particles to cause crystal damage in a defined area below a surface of the semiconductor body.

A growth rate of the anodic oxide structure 108 may be accelerated by irradiating the semiconductor body 104 with particles 114 from the first side 106 prior to anodic oxide structure formation as is illustrated in the schematic cross-sectional view of FIG. 2. The irradiation with the particles 114 may be perpendicular to the first side 106 (see irradiation labeled (a)) and/or slightly inclined (see irradiations labeled (b), (c)).

Particle irradiation perpendicular to the first side 106 may cause crystal damage 116, for example vacancies and interstitial atoms, double vacancies, vacancy-oxygen complexes or other complexes containing vacancies or interstitials below a bottom side of the first trench 102. Irradiations at different angles may cause broadening of a depth range of the crystal damage 116, for example. Particle irradiation may be carried out by any suitable processes, for example by ion implantation. Examples of particles are protons, phosphorus, selenium, antimony and arsenic. When irradiating the semiconductor body 104 with protons, subsequent thermal annealing in a temperature range of 350° C. to 500° C. for a duration in a range of several ten minutes to several hours may also be used to convert a previously p-doped part of the semiconductor body 104 into an n-doped part caused by generation of hydrogen-related donors being proton irradiation-induced defect complexes. After irradiating the semiconductor body 104 with the particles to cause crystal damage, the first trench 102 may be formed into the semiconductor body 104 from the first side 106. According to an embodiment, a bottom side of the first trench lies in the depth range of the crystal damage 116.

The crystal damage 116 induced by particle irradiation may lead to an accelerated anodic oxidation process caused by a defect induced enhanced oxidation rate upon the semiconductor body 104.

Figure 3:
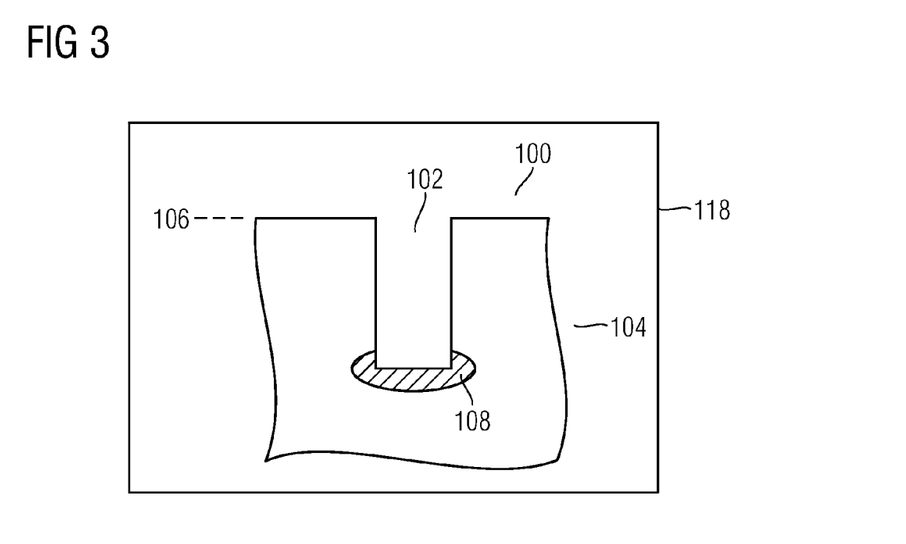
FIG. 3 is schematic cross-sectional view of a semiconductor body for illustrating an embodiment of annealing the semiconductor body in a thermal processing equipment.

According to an embodiment illustrated in FIG. 3, the semiconductor body 104 is annealed in a thermal processing equipment 118. Examples of thermal processing include furnace annealing, lamp based heating, hot chuck or hot plate annealing. The process of annealing the semiconductor body may lead to a densification of the anodic oxide structure 108 and/or to a homogenization. An annealing temperature or temperature profile as well as a duration of thermal processing may be appropriately chosen in regard to process compatibility and/or desired anodic oxide transformation. The annealing temperature may be greater than 200° C., or greater than 500° C., or even greater than 900° C., for example. According to an embodiment, the annealing temperature ranges between 200° C. and 1200° C., or between 500° C. and 1100° C. Annealing durations may range, depending upon specific thermal processing equipment, between some minutes to some hours.

Figure 4:
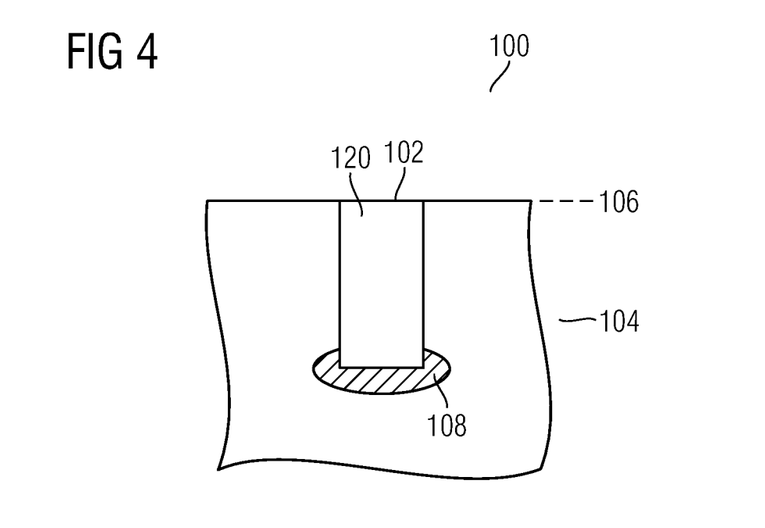
FIG. 4 is schematic cross-sectional view of a semiconductor body for illustrating an embodiment of filling a first trench with a filling structure.

With respect to the embodiment illustrated in the schematic cross-sectional view of FIG. 4, the first trench 102 is filled with a filling structure 120. The filling structure 120 may include conductive and/or insulating material(s) and a formation of the filling structure 120 in the first trench 102 may also include a process of removing unwanted material(s) of the filling structure 120 formed on the first side 106 of the semiconductor body 104. For removing material of the filling structure 120 from the first side, any appropriate process(es), for example etching and/or chemical-mechanical polishing (CMP) may be used.

According to an embodiment, the filling structure 120 is a semiconductor material or a sequence of semiconductor materials, for example formed by epitaxial growth or deposition. In this case, the anodic oxide structure separates the filling structure 120 from the semiconductor body 104 below the filling structure 120. The filling structure and the semiconductor body may be formed of a same semiconductor material, for example silicon or silicon carbide. The filling structure 120 together with a laterally surrounding part of the semiconductor body 104 may be used as an active area of circuit elements formed therein in subsequent processes, for example.

By way of example, the anodic oxide structure 108 may be arranged below source zones of a field effect transistor formed in the semiconductor body 104 for avoiding or suppressing latch-up of minority carrier injection caused by the source zones. By way of another example, the anodic oxide structure 108 may be arranged in a p-type body region of an insulated gate bipolar transistor (IGBT) for causing hole accumulation, thereby achieving a reduced collector-emitter saturation voltage $V_{CEsat}$. By way of yet another example, the anodic oxide structure 108 may serve as a buried charge trapping region.

Figure 5:
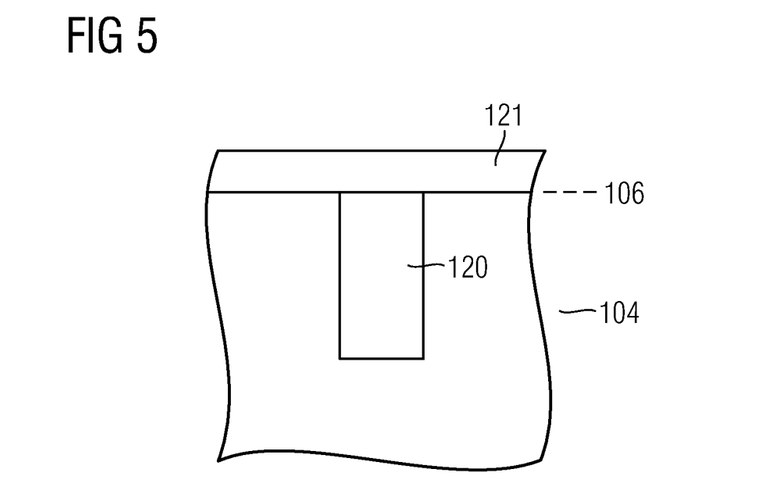
FIG. 5 is schematic cross-sectional view of a semiconductor body for illustrating an embodiment of forming one or a plurality of semiconductor layer(s) on the semiconductor body.

According to an embodiment illustrated in FIG. 5, one or a plurality of semiconductor layer(s) 121 are formed at the first side 106 on the semiconductor body 104, for example by epitaxial growth or deposition. The one or more semiconductor layer(s) 121 may serve as an active area for circuit elements formed therein in subsequent processes, for example. By way of example, drift zones of semiconductor devices such as transistors or diodes may be formed in the one or more semiconductor layer(s) in subsequent processes, for example.

Figure 6A:
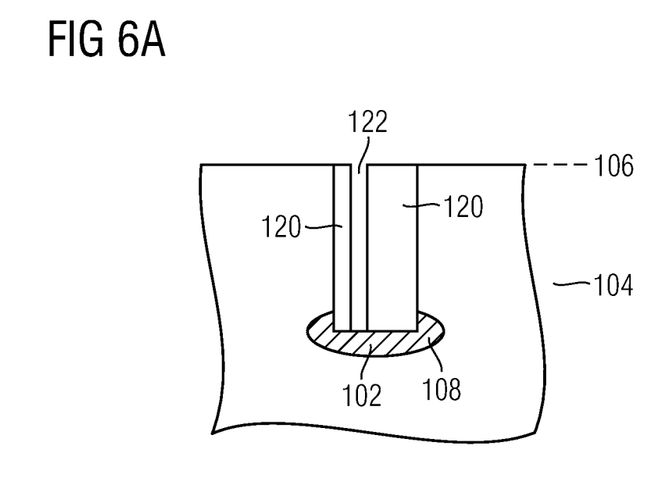
FIGS. 6A and 6B are schematic cross-sectional views of a semiconductor body for illustrating an embodiment of removing the anodic oxide structure in the first trench.
Figure 6B:
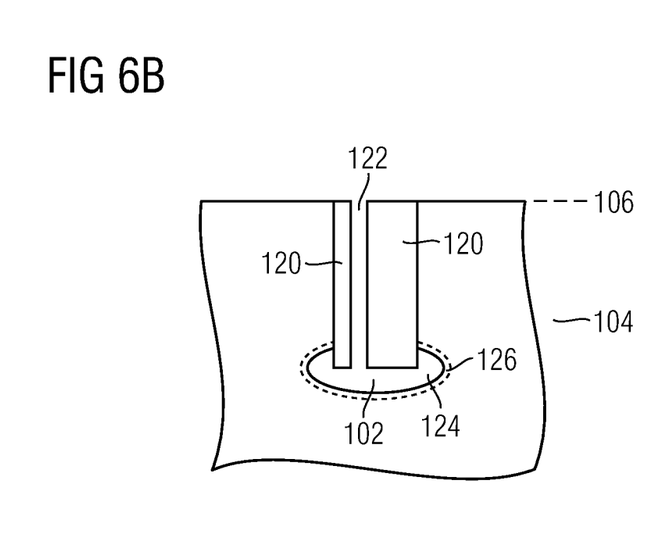

According to an embodiment illustrated in the schematic cross-sectional views of the semiconductor body 104 in FIGS. 6A and 6B, a process trench 122 is formed through the filling structure 120 of the semiconductor body 104, thereby exposing at least a part of the anodic oxide structure 108. The process trench 122 may be formed by a masked etching process, such as dry or wet etching. As is illustrated in the schematic cross-sectional view of FIG. 6B, the anodic oxide structure is removed in the first trench by inserting an etch solution through the process trench 122. The etch solution may be appropriately chosen with respect to etch selectivity between the anodic oxide structure 108 and surrounding parts of the semiconductor body 104 including the filling structure 120. By way of example, hydrofluoric acid (HF) may be chosen to selectively etch the anodic oxide structure 108 surrounded by a silicon semiconductor body. After etching of the anodic oxide structure 108, a buried void structure 124 remains at a bottom side of the first trench 102.

The buried void structure 124 may serve for various purposes.

According to an embodiment the buried void structure 124 acts as or is at least partly by a recombination structure configured to act as a recombination zone attracting electron-hole recombination, for example for avoiding latch-up. According to another embodiment, the buried void structure 124 remains in a semiconductor device manufactured in the semiconductor body 104 for acting as a hole accumulation region. According to yet another embodiment, the semiconductor body 104 is doped through walls of the buried void structure 124 by inserting a doping gas into the buried void structure 124 via the process trench 122. This may lead to a doped region 126 surrounding the buried void structure 124. According to yet another embodiment, a cooling medium is inserted into the buried void structure 124 via the process trench 122. The cooling medium may be a phase change material, for example. According to yet another embodiment, the buried void structure 124 may extend along any direction perpendicular to the drawing plane of FIG. 6B and act as a light guide. The buried void structure 124 may also be used to form any kind of devices based on membranes formed between the buried void structure 124 and the first side 106. The membrane may also be part of a membrane-based sensor such as an acceleration sensor or a pressure sensor, for example.

Figure 7:
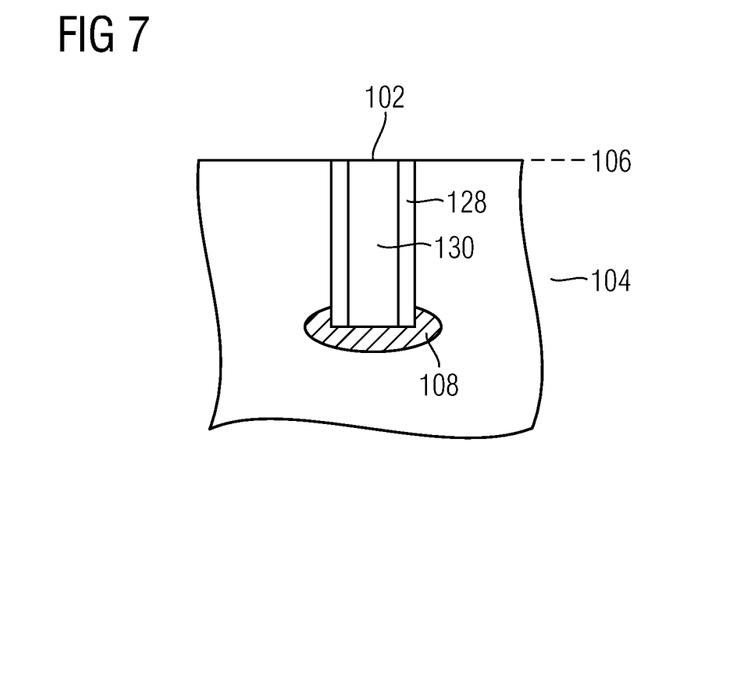
FIG. 7 is schematic cross-sectional view of a semiconductor body for illustrating an embodiment of forming a gate structure in the first trench with the anodic oxide structure being a bottom oxide.

According to another embodiment illustrated in the schematic cross-sectional view of FIG. 7, the anodic oxide structure 108 constitutes a bottom oxide of a gate structure. Formation of the gate structure further includes forming a gate dielectric 128 at walls of the first trench 102, for example by dielectric layer deposition or growth such as thermal oxidation. A gate electrode 130 including conductive material(s), for example metal(s) and/or highly doped semiconductor(s) such as highly doped polycrystalline silicon is formed in the first trench 102. A thickness of the anodic oxide structure 108 at the bottom side of the first trench 102 is greater than a thickness of the gate dielectric for improving a switching behavior and/or a reliability of semiconductor devices including the anodic oxide structure 108 as part of the gate structure. According to other embodiments, the gate structure may also include one or more field electrodes arranged between the gate electrode 130 and the anodic oxide structure 108. While parts of the anodic oxide structure 108 may also overlap parts of walls of the first trench 102, thereby increasing a lateral dielectric breakdown strength, the gate dielectric 128 may also be partly replaced or thickened by a field dielectric, for example in areas of the first trench 102 where field electrodes may be placed.

Another embodiment of a method of manufacturing a semiconductor arrangement 100 is illustrated in the schematic cross-sectional views of FIGS. 8A to 8D.

Figure 8A:
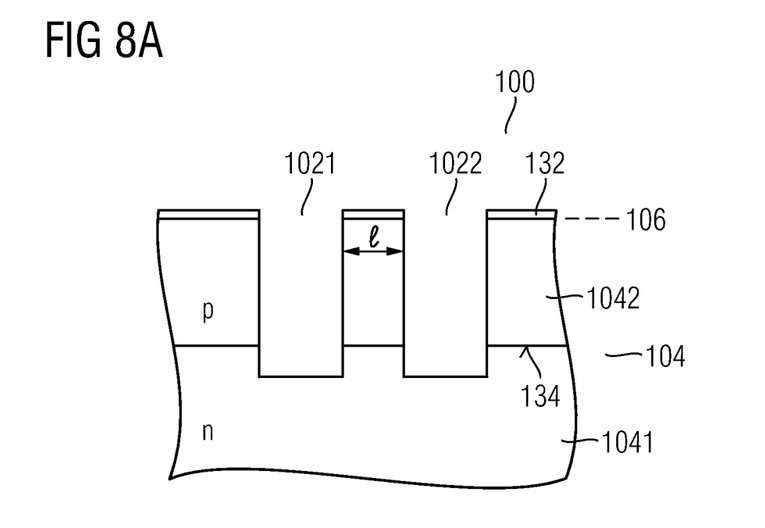
FIGS. 8A to 8C are schematic cross-sectional views of a semiconductor body for illustrating an embodiment of a method of manufacturing a semiconductor arrangement.

With reference to the schematic cross-sectional view of FIG. 8A, first and second trenches 1021, 1022 are formed into the semiconductor body 104 from the first side 106 by an etch process having a part of a surface of the semiconductor body 104 at a first side 106 covered by a mask structure 132. The semiconductor body 104 includes a first semiconductor body part 1041 and a second semiconductor body part 1042 on the first semiconductor body part 1041 at the first side 106. The first and second semiconductor body parts 1041, 1042 differ by at least one of doping concentration and conductivity type.

In the embodiment illustrated in FIG. 8A, the first semiconductor body part 1041 is of n-type conductivity and the second semiconductor body part 1042 is of p-type conductivity. The first and second trenches 1021, 1022 extend through the second semiconductor body part 1042 into the first semiconductor body part 1041. According to an embodiment, the second semiconductor body part 1042 is a p-doped semiconductor layer formed on the n-type first semiconductor body part 1041 by epitaxy, for example. According to another embodiment, the second semiconductor body part 1042 is formed by introducing p-type dopants into the semiconductor body 104 through the first side 106 by an appropriate process such as ion implantation and/or diffusion.

A pn junction 134 is located at an interface between the n-type first semiconductor body part 1041 and the p-type second semiconductor body part 1042.

Figure 8B:
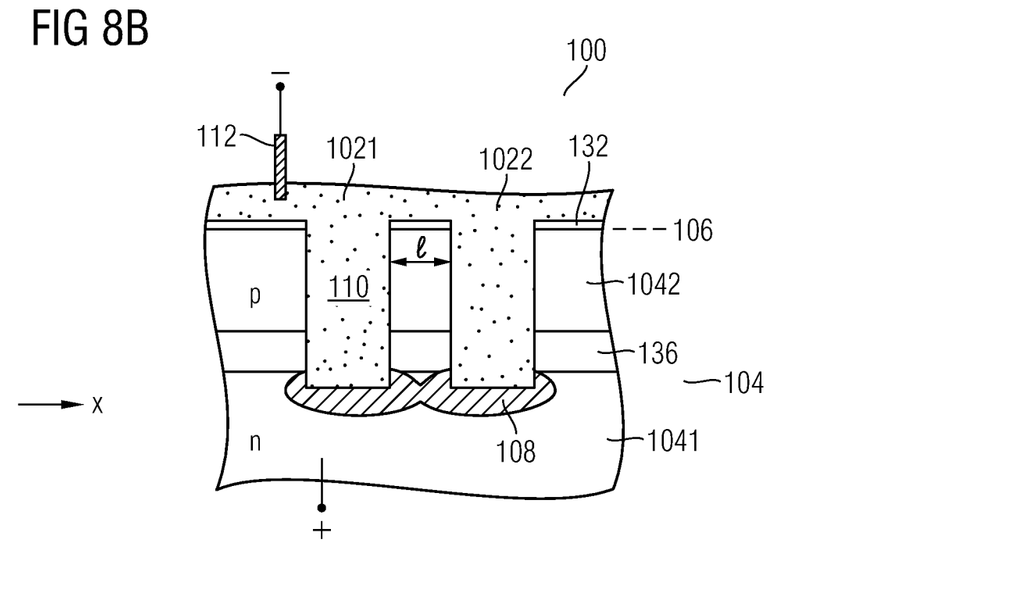

With reference to the schematic cross-sectional view of FIG. 8B, the anodic oxide structure 108 is formed at the bottom side of the first and second trenches 1021, 1022 by immersing the semiconductor body 104 in the electrolyte 110 and by applying an anodizing voltage between the n-doped first semiconductor body part 1041 and the electrode 112 in contact with the electrolyte 110. Since the anodic oxidation process is driven by an electric field strength, anodic oxidation mainly occurs at the boundary between the first semiconductor body part 1041 and the electrolyte 110 and along a space charge region 136 between the n-doped first semiconductor body part 1041 and the p-doped second semiconductor body part 1042.

According to the embodiment illustrated in FIG. 8B, formation of the anodic oxide structure 108 is terminated after anodic oxide parts of the anodic oxide structure 108 at the bottom side of the first and second trenches 1021, 1022 merge along a lateral direction x between the first and second trenches 1021, 1022. A lateral distance 1 between the first and second trenches 1021, 1022 may be chosen in consideration of a duration of the anodic oxidation and applied voltage for merging the parts at the bottom side of the first and second trenches 1021, 1022. According to an embodiment, the lateral distance at the first side 106 is less than 5 μm, or less than 2 μm, or less than 1 μm.

After formation of the anodic oxide structure 108, the electrolyte 110 is removed, for example by taking out the semiconductor body 104 from an electrolyte bath, for example followed by one or more cleaning processes. Optional annealing, for example as illustrated and described with respect to FIG. 3 may follow to densify and/or homogenize the anodic oxide structure 108.

Figure 8C:
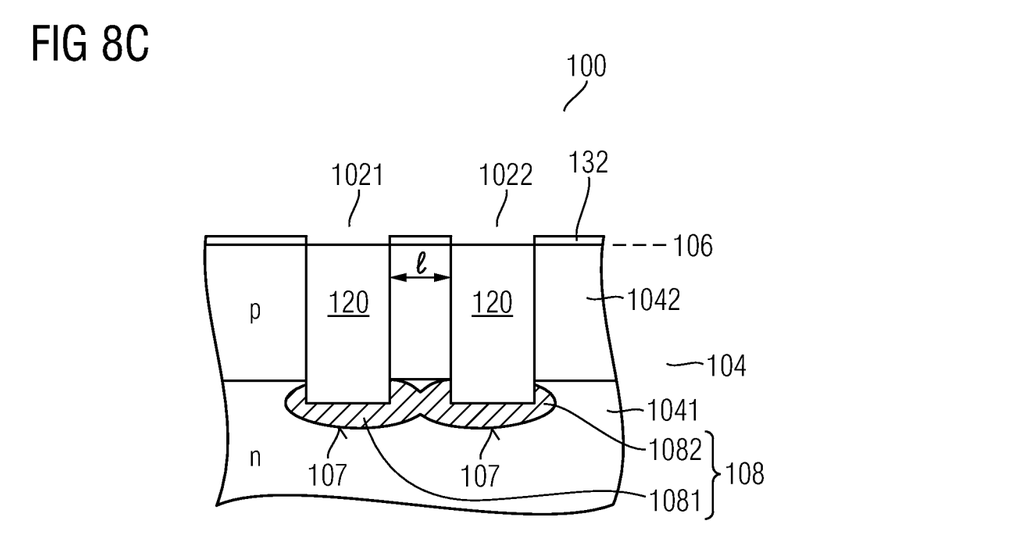

With reference to the schematic cross-sectional view of FIG. 8C, the filing structure 120 is formed in the first and second trenches 1021, 1022. Any one of or multiple of the processes illustrated and described with respect to FIGS. 2 to 7 may be integrated into a process sequence including the processes illustrated with regard to the embodiment of FIGS. 8A to 8C.

When forming additional trenches together with the first and second trenches 1021, 1022 and carrying out anodic oxide formation at the bottom side of these trenches, any desired shape of an anodic oxide structure 108 may be formed in the semiconductor body 104. According to an embodiment, the anodic oxide structure 108 is formed as a continuous buried oxide structure including none, one or even more openings. According to another embodiment, the anodic oxide structure 108 includes a plurality of distinct anodic oxide structure parts for providing a dielectric isolation between the first semiconductor body part 1041 and the second semiconductor body part 1042 only in some areas of the semiconductor body 104. A lateral electric isolation between different areas of the second semiconductor body part 1042 separated by trenches such as the first and second trenches 1021, 1022 may lead to an overall electric isolation of areas of the second semiconductor body part 1042 with regard to any surrounding parts of the semiconductor body 104.

According to an embodiment, the anodic oxide structure 108 buried in the semiconductor body 104 is a continuous anodic oxide structure providing a complete electric isolation between a part of the semiconductor body 104 arranged above the anodic oxide structure 108 and a part of the semiconductor body 104 arranged below the anodic oxide structure 108.

According to an embodiment of a semiconductor arrangement illustrated in FIG. 8C, the anodic oxide structure 108 includes at least two buried anodic oxide parts 1081, 1082 merged together, each of the at least two buried anodic oxide parts 1081, 1082 having a convex surface portion 107. According to an embodiment, electrolyte remainders are present in the anodic oxide structure 108.

Figure 9A:
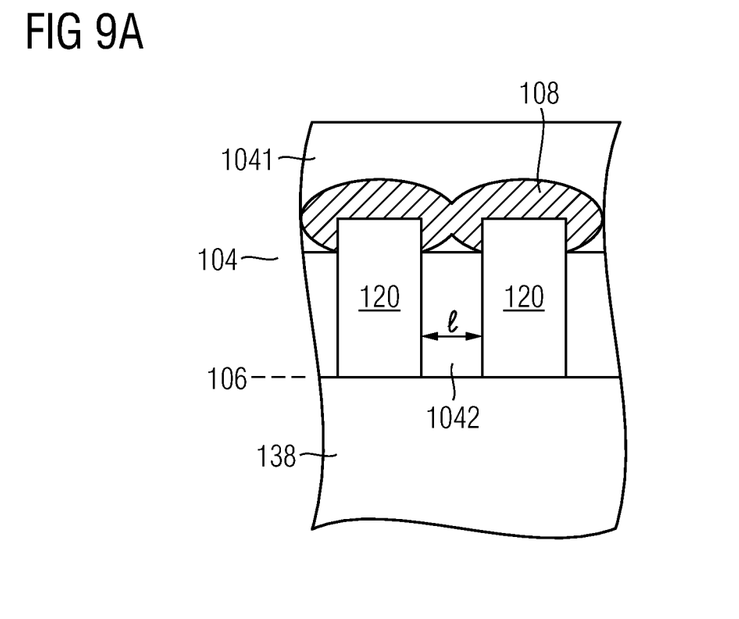
FIGS. 9A to 9D are schematic cross-sectional views of a semiconductor body for illustrating another embodiment of a method of manufacturing a semiconductor arrangement.

With respect to the schematic cross-sectional of FIG. 9A, the semiconductor body 104 including the anodic oxide structure 108 is bonded to a carrier substrate 138 via the first side 106. The carrier substrate 138 may be an insulating substrate or a conductive substrate such as carbon or graphite and may include an optional protection layer, for example a polycrystalline silicon layer, an amorphous silicon layer or a silicon carbide layer.

Figure 9B:
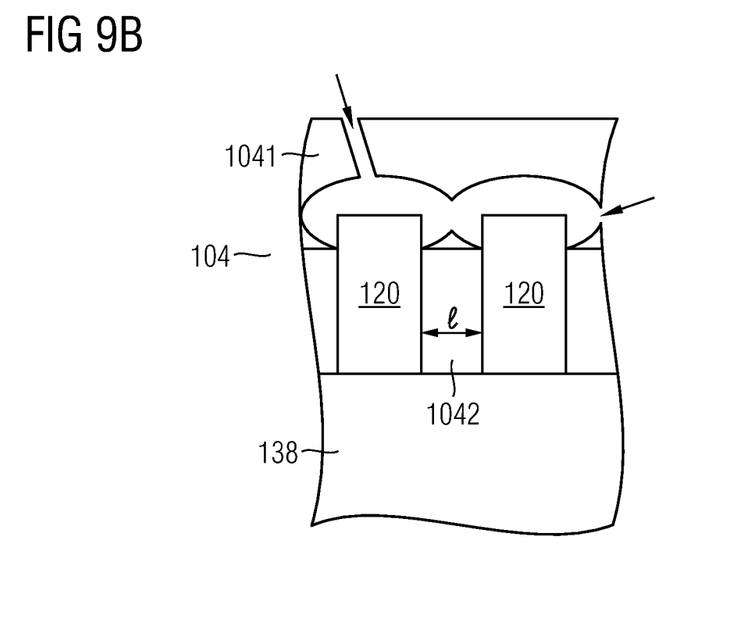

With reference to the schematic cross-sectional view of FIG. 9B, one or more access channels are formed in the first semiconductor body part 1041 ending on the anodic oxide structure. The access channels are illustrated in FIG. 9B in a simplified manner by arrows and may be formed by mechanical and/or chemical processes from a main surface or lateral face of the first semiconductor body part 1041, for example by etching and/or drilling. The anodic oxide structure 108 is removed, for example by an etch process such as HF etching of silicon by accessing the anodic oxide structure 108 via the access channels.

Figure 9C:
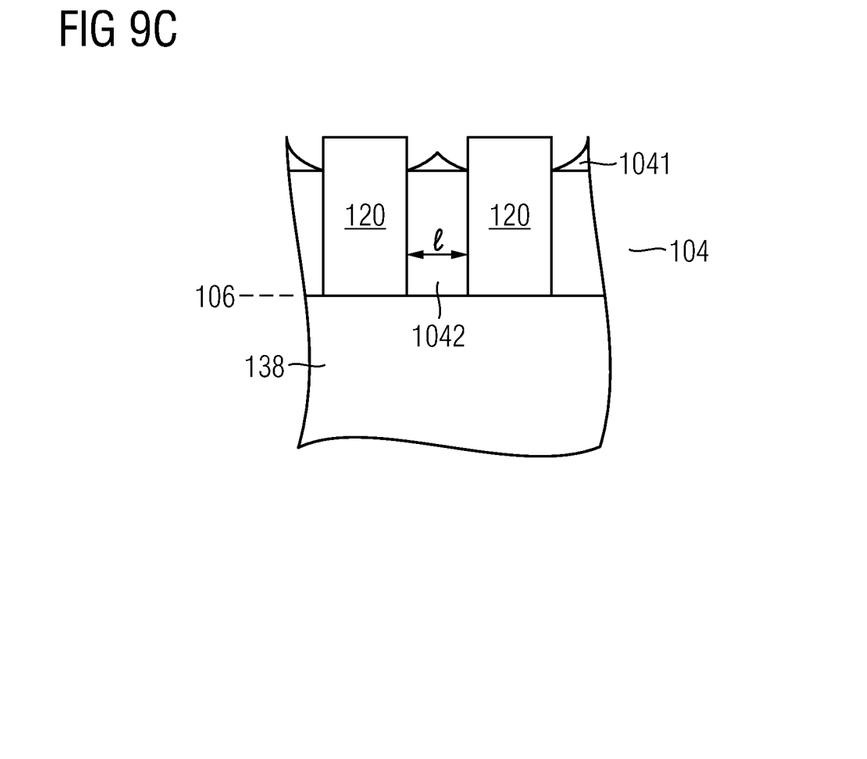

With reference to the schematic cross-sectional view of FIG. 9C, the first semiconductor body part 1041 is separated from the second semiconductor body part 1042 and may be reused, for example after planarization, for carrying out a new sequence of processes as illustrated in the embodiments above. A separation process may include application of mechanical force for separation, introduction of hydrogen into the first semiconductor body part 1041 and heating the semiconductor body above a splitting temperature, for example. A small fraction of the first semiconductor body part 1041 may remain on the second semiconductor body part 1042.

Figure 9D:
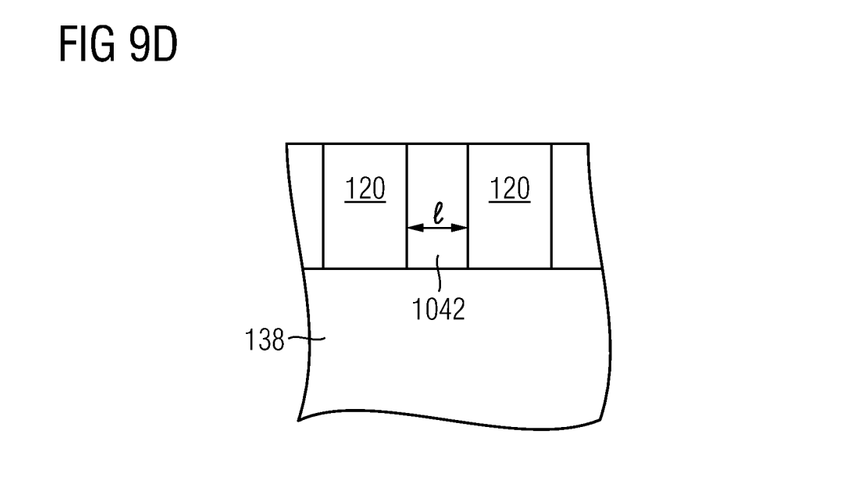

With reference to the schematic cross-sectional view of FIG. 9D, a remaining part of the semiconductor body 104 including the second semiconductor body part 1042 is planarized, for example by mechanical and/or chemical mechanical processes. Further processes may follow to form any desired discrete semiconductors or integrated circuits in the second semiconductor body part 1042. Depending upon a mechanical strength of the second semiconductor body part 1042 after separation, the carrier substrate 138 may remain or be removed by mechanical and/or chemical processes.

The schematic cross-sectional view of FIG. 9D may also be achieved starting from FIG. 9A by removing the first semiconductor body part 1041, for example by chemical or chemical-mechanical processes terminated by exposure of the anodic oxide structure 108, followed by removal of the anodic oxide structure 108 and planarization as described with reference to FIG. 9D.

The embodiments described above provide a cost-effective method of manufacturing a semiconductor arrangement by anodic oxidation without the need of high dose implants and bonding processes.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor arrangement, the method comprising:
    forming a first trench into a semiconductor body from a first side;
    forming an anodic oxide structure at a bottom side of the first trench by immersing the semiconductor body in an electrolyte and applying an anodizing voltage between the semiconductor body and an electrode in contact with the electrolyte; and further comprising:
    forming a second trench into the semiconductor body from the first side; and
    forming the anodic oxide structure at the bottom side of the second trench by immersing the semiconductor body in the electrolyte.

2. The method of claim 1, further comprising forming the first and the second trenches at a lateral distance at the first side of less than 5 μm.

3. The method of claim 1, wherein forming the anodic oxide structure is terminated after anodic oxide parts of the anodic oxide structure at the bottom side of the first and the second trenches merge along a lateral direction between the first and the second trenches.

4. The method of claim 1, further comprising:
    forming a semiconductor material in the first and the second trenches;
    bonding the semiconductor body to a carrier substrate via the first side;
    forming access channels through the semiconductor body to the anodic oxide structure;
    removing the anodic oxide structure;
    separating a first part of the semiconductor body from the carrier substrate and a second part of the semiconductor body; and
    planarizing the semiconductor body.

5. The method of claim 4, wherein the first part of the semiconductor body is separated from the carrier substrate and the second part of the semiconductor body by applying mechanical force.

6. The method of claim 4, wherein the first part of the semiconductor body is separated from the carrier substrate and the second part of the semiconductor body by introduction of hydrogen into the first part and heating the semiconductor body above a splitting temperature.

7. The method of claim 1, further comprising forming a semiconductor material in the first and the second trenches.

8. The method of claim 7, further comprising forming the semiconductor material in the first and the second trenches by epitaxial growth.

9. The method of claim 1, further comprising, prior to forming the anodic oxide structure, annealing the semiconductor body.

10. The method of claim 9, wherein an annealing temperature ranges between 200° C. and 1200° C.

11. The method of claim 1, wherein the semiconductor body includes a first semiconductor body part and a second semiconductor body part on the first semiconductor body part at the first side, wherein the first and the second semiconductor body parts differ by at least one of doping concentration and conductivity type, and wherein the method further comprises:

forming the first trench extending through the second semiconductor body part into the first semiconductor body part.

12. The method of claim 11, wherein the second semiconductor body part is a p-doped semiconductor layer on an n-doped semiconductor layer of the first semiconductor body part.

13. The method of claim 11, further comprising forming a semiconductor layer on the second semiconductor body part.

14. A method of manufacturing a semiconductor arrangement, the method comprising:

forming a first trench into a semiconductor body from a first side;

forming an anodic oxide structure at a bottom side of the first trench by immersing the semiconductor body in an electrolyte and applying an anodizing voltage between the semiconductor body and an electrode in contact with the electrolyte;

forming an insulating layer in the first trench, wherein the insulating layer is a gate dielectric and the anodic oxide structure is a bottom dielectric; and forming a gate electrode in the first trench.

15. A method of manufacturing a semiconductor arrangement, the method comprising:

forming a first trench into a semiconductor body from a first side;

forming an anodic oxide structure at a bottom side of the first trench by immersing the semiconductor body in an electrolyte and applying an anodizing voltage between the semiconductor body and an electrode in contact with the electrolyte;

filling the first trench with a material; and removing the anodic oxide structure in the first trench by forming a process trench into the semiconductor body from the first side, thereby exposing at least part of the anodic oxide structure, and inserting an etch solution through the process trench to the anodic oxide structure, thereby removing the anodic oxide structure and forming a buried void structure.

16. The method of claim 15, further comprising:

doping the semiconductor body through walls of the buried void structure by inserting a doping gas into the buried void structure via the process trench.

17. The method of claim 15, further comprising inserting a cooling medium into the buried void structure via the process trench.

18. The method of claim 17, wherein the cooling medium is a phase change material.

19. A method of manufacturing a semiconductor arrangement, the method comprising:

forming a first trench into a semiconductor body from a first side;

forming an anodic oxide structure at a bottom side of the first trench by immersing the semiconductor body in an electrolyte and applying an anodizing voltage between the semiconductor body and an electrode in contact with the electrolyte; and further comprising, prior to anodic oxide structure formation, irradiating the semiconductor body with particles from the first side.

20. The method of claim 19, wherein the particles include one of protons, phosphorus, selenium, antimony, arsenic.

21. A semiconductor arrangement, comprising:

a semiconductor body; and an anodic oxide structure buried in the semiconductor body, wherein the buried anodic oxide structure includes at least two buried anodic oxide parts merged together, each of the at least two buried anodic oxide parts having a convex surface portion.

22. The semiconductor arrangement of claim 21, further comprising an electrolyte remainder in the anodic oxide structure.

* * * * *